United States Patent [19]

Jones

[11] Patent Number: 5,675,246
[45] Date of Patent: Oct. 7, 1997

[54] CURRENT FLOW INDICATOR

[75] Inventor: Thaddeus M. Jones, Bremen, Ind.

[73] Assignee: MSX, Inc., South Bend, Ind.

[21] Appl. No.: 619,259

[22] Filed: Mar. 18, 1996

[51] Int. Cl.⁶ .......................... G01R 19/00; G08B 17/00
[52] U.S. Cl. .......................... 324/122; 340/595
[58] Field of Search .......................... 324/122, 133; 340/595, 661, 662, 664; 361/106

[56] References Cited

U.S. PATENT DOCUMENTS

| | | | |
|---|---|---|---|
| 3,840,834 | 10/1974 | Obenhaus et al. | 361/106 |
| 3,872,355 | 3/1975 | Klein et al. | 361/106 |
| 4,238,812 | 12/1980 | Middleman et al. | 361/106 |
| 4,310,837 | 1/1982 | Kornrumpf et al. | 340/598 |

*Primary Examiner*—Ernest F. Karlsen
*Attorney, Agent, or Firm*—R. Tracy Crump

[57] ABSTRACT

An apparatus connectable between a current source and an electrical load for indicating current flow through the load above a threshold level. The indicator includes two negative temperature coefficient (NTC) thermistors, and a neon indicator lamp. The first thermistor is connected directly in series with the electrical load and the second thermistor is connected in series with the neon lamp. The thermistors are packaged together by an epoxy resin, which thermally couples the thermistors so that both thermistors operate at substantially identical temperatures. Current flow above the load's operational threshold level causes the first thermistor to heat to an equilibrium temperature well above the ambient temperature. At this elevated equilibrium temperature, both resistors have extremely low resistance values. The low resistance value of the second thermistor permits maximum current flow to the neon lamp, which illuminates the lamp. As the current flow through the load drops, the self-heating experienced by the first thermistor decreases and the resistance value of the second thermistor increases. When the current flow through the load falls below the load's operational threshold level, the resistance value of the second thermistor is sufficiently high to limit the current flow to the neon lamp and prevent illumination. The failure of the neon lamp to illuminate provides a visual indication that the current flow to load is below the load's operational threshold.

3 Claims, 2 Drawing Sheets

CURRENT FLOW INDICATOR

This invention relates to an apparatus used to indicate current flow through an electrical load, and in particular, an apparatus, which is connected as a separate component between the current source and the load for indicating current flow through a load above a threshold level.

BACKGROUND OF THE INVENTION

In many electrical applications, current flow indication provides a means for determining the operational state of electrical loads and control devices. This method is commonly used in commercial and industrial temperature and heater control systems. In electrical temperature and heater control systems, such as those used for freeze protection, the absence of current flow to electrical heaters at sub-freezing temperatures is a serious problem, which requires immediate attention. Loss of the current flow in electrical freeze protection systems can result in damage to plumbing and piping, as well as, the failure of wet fire protection sprinklers.

Conventional current flow indicating devices employ current transformers and electrical components. Because of the expense of current transformers and the other electrical components needed for conventional current flow indication, current indication is not practical for small electrical systems. Electrical systems designed for consumer markets often forego current indication features due to the expense of such a feature. Consequently, a simple, reliable, and cost effective current flow indicator is desirable. In particular, a current flow indicator which can be connected as a separate component between the current source and the load in a simple electrical application, would be desirable for a variety of consumer applications, such as electrical freeze protection systems.

SUMMARY OF THE INVENTION

The apparatus of this invention can be connected as a separate component in series between the current source and the electrical load of any electrical system to effectively and inexpensively indicate current flow through the load above a threshold level. The current flow indicator of this invention is particularly well suited for use in electrical heater control applications and heating cable applications. The indicator can be readily connected as a separate component between the current source (power line outlet) and the heating cable.

The current flow indicator of this invention includes two negative temperature coefficient (NTC) thermistors, a neon indicator lamp and two resistors, which form a voltage divider. The first thermistor is connected directly in series with the electrical load and the second thermistor is connected in series with the neon lamp. The first thermistor is of the type which are commonly used for inrush current limiting in electronic power supplies. Current flow causes significant self-heating in this type of thermistor. The second thermistor is of the type used for temperature sensing. This type of thermistor is selected because the current flow during any operational condition does not cause sufficient self heating to effect its resistance value. The thermistors are packaged together by a suitable epoxy resin, which thermally couples the thermistors. The epoxy resin conducts heat so that both thermistors have substantially identical temperatures. The neon lamp operates from current flow through the second thermistor and illuminates only when the current flow through the load is above a threshold operational level. The second thermistor and other resistors form a voltage divider, which attenuates the voltage supply to the neon lamp during operation.

Current flow above the operational threshold required by the electrical load causes the first thermistor to heat to an equilibrium temperature well above the ambient temperature (100° C., or more, above the ambient temperature). Since the thermistors are thermally coupled by epoxy resin, the thermal energy from the first thermistor is transferred to the second thermistor. At this elevated equilibrium temperature, both resistors have extremely low resistance values. The low resistance value of the second thermistor permits maximum current flow to the neon lamp. Consequently, when the current flows through the load above the load's operational threshold level, the resistance value of the second thermistor is at a minimum and the neon lamp reaches its full intensity. As the current flow through the load drops, the self-heating experienced by the first thermistor decreases and the resistance value of the second thermistor increases. When the current flow through the load falls below the load's operational threshold level, the resistance value of the second thermistor is sufficient to limit the current flow to the neon lamp to prevent illumination. The failure of the neon lamp to illuminate provides a visual indication that the current flow to load is below the load's operational threshold.

Accordingly, an advantage of this invention is to provide for an apparatus which effectively and inexpensively indicates current flow through a load above a threshold level.

Another advantage of this invention is that the current flow indicator of this invention can be connected as a separate component between the current source and the load to provide a visual indication of load operation.

Another advantage of the invention is that the current flow indicator can be used to indicate heater operation in temperature and heater control applications, such as freeze protection systems.

Other advantages will become apparent upon a reading of the following description.

BRIEF DESCRIPTION OF THE DRAWINGS

A preferred embodiment of the invention has been depicted for illustrative purposes only wherein.

DESCRIPTION OF THE PREFERRED EMBODIMENT

The preferred embodiment herein described is not intended to be exhaustive or to limit the invention to the precise form disclosed. It is chosen and described to best explain the invention so that others skilled in the art might utilize its teachings.

Figure 1:
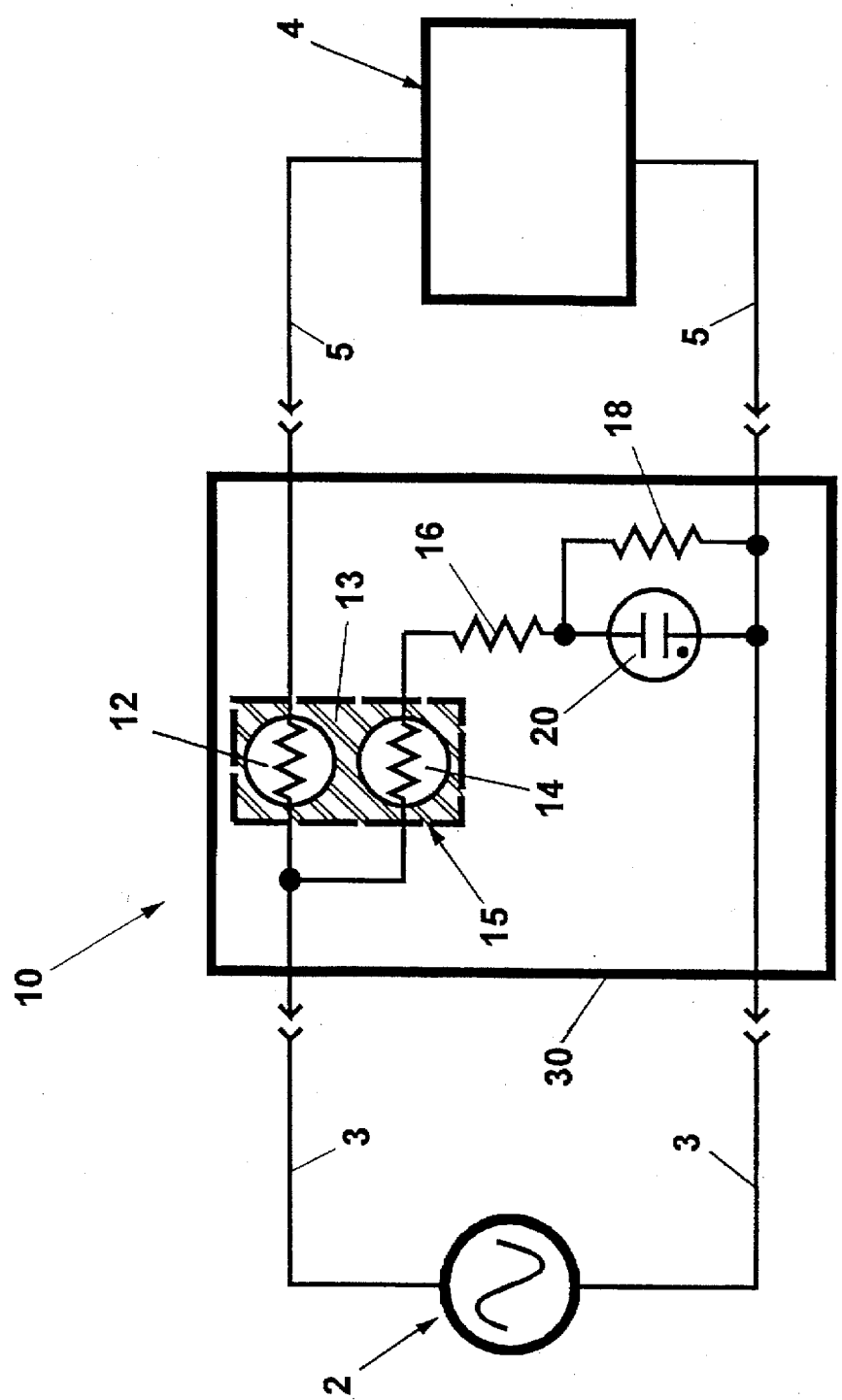
FIG. 1 is a schematic of the current flow indicator of this invention used in a typical electrical heater application.

FIGS. 1 shows the current flow indicator 10 of this invention used in a typical electrical application, i.e., an electrical heating system. The current flow indicator of this invention is used to indicate the presence of current flow above a threshold value in any electrical system application. As shown, indicator 10 is connected as a separate component between a current source 2 and a load 4 by wire leads 3, 5. In this description, current source 2 is a power line outlet and load 4 is a conventional electrical heating device and its controller, although the teachings of this invention are applicable to any current source and electrical load. Although indicator 10 is shown in the figures and described herein as a separate component connected between the current source and the load, the circuitry of the indicator can be readily incorporated into the circuitry at the current source of the load.

Figure 2:
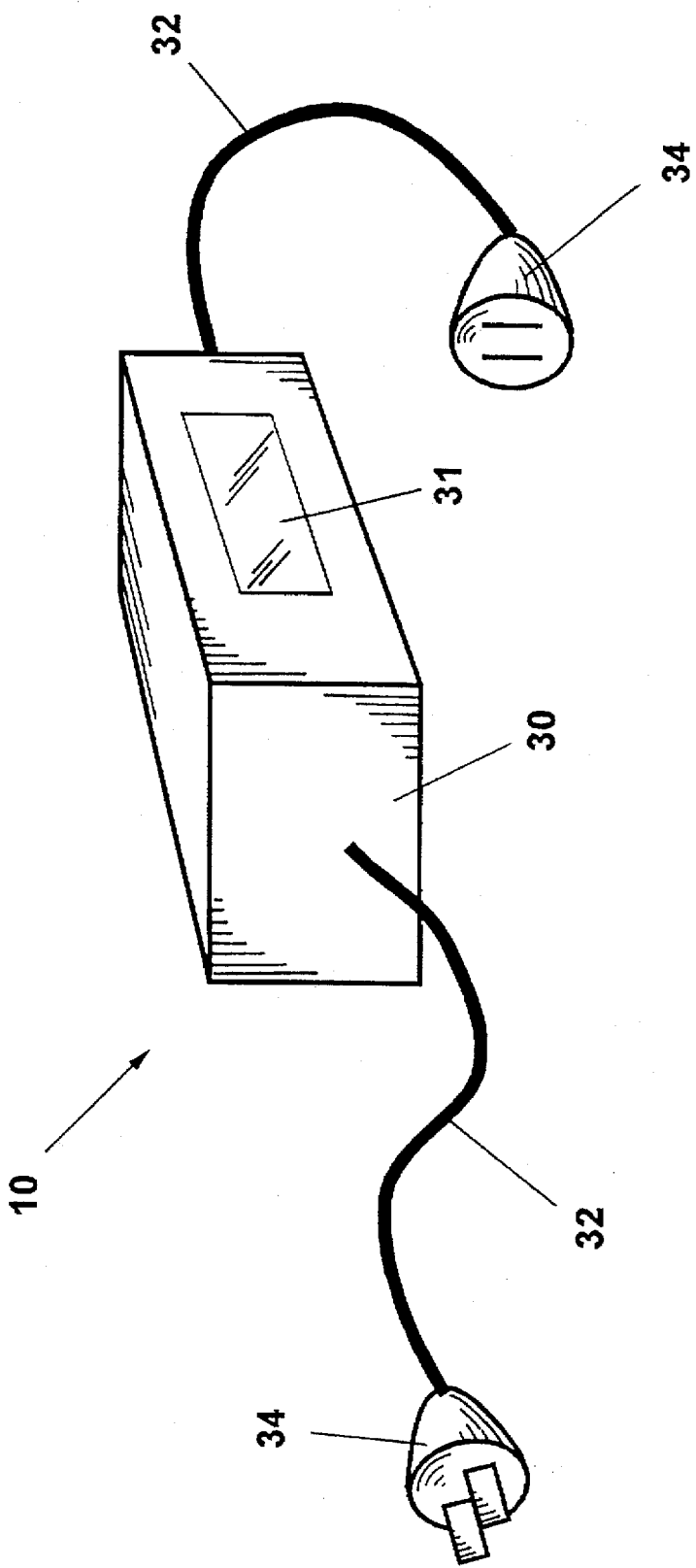
FIG. 2 is a perspective view of the current flow indicator of this invention.

As shown in FIG. 1, the circuitry of indicator 10 includes: two negative temperature coefficient (NTC) thermistors 12 and 14; a neon lamp 20; and two resistors 16 and 18. As shown in FIG. 2, the electrical circuitry of indicator 10 is enclosed by a protective outer housing 30. The outer housing 30 is constructed of any suitable material and can assume any suitable configuration. Preferably, housing 11 is constructed of a transparent material or has a window 31 (FIG. 2.) through which neon lamp 20 is visible. Indicator 10 also includes wire leads 32 and connector plugs 34 for convenient connection between current source 2 and load 4.

As is commonly known in the electrical arts, the resistance of NTC thermistors varies inversely with temperature. Preferably, thermistor 12 is of the type which is commonly used for inrush current limiting in electronic power supplies. This type of thermistor is selected because high current flow causes significant self heating in the order of one to five watts. Thermistor 12 is also selected to have an extremely low resistance value at high temperatures, generally in the range of 100° C., or more, above the ambient temperature. Thermistor 14 is of the type used for temperature sensing. This type of thermistor is selected because the current flow during any operational condition does not cause sufficient self heating to effect its resistance value. Thermistor 14 also is selected to have a significantly higher resistance value at high temperatures than thermistor 12.

As shown in FIG. 1, thermistor 12 is connected directly in series with load 4. Thermistor 14, resistor 16 and neon lamp 20 are connected in parallel to thermistor 12 and load 4. Thermistors 12 and 14 are intimately packaged together by an epoxy resin (designated by numeral 13). Collectively, thermistors 12 and 14 in the epoxy resin are referred to herein as thermistor package 15. The epoxy resin has a superior thermal conductivity to that of air, and thermally couples thermistors 12 and 14 together. Epoxy resin 13 facilitates the conduction of thermal energy between thermistors 12 and 14 so that both thermistors operate at substantially identical temperatures. Any suitable bonding material with the desired thermal conductivity properties, such as high temperature wax, can be substituted for the epoxy resin.

Indicator 10 uses neon lamp as the means for visually indicating the presence of current flow, but any suitable light source, such as a light emitting diode (LED), can be incorporated within the teaching of this invention. Neon lamp 20 operates from current flow through thermistor 14 and glows only when the current flow through the load is above a threshold operational level. Generally, the ionization potential of neon lamps is such that they will not glow unless the instantaneous voltage applied to it is above a threshold voltage of approximately 65 volts. Resistor 18 is connected in parallel to neon lamp 20 to act as a shunt. Thermistor 14 and resistors 16 and 18 form a voltage divider, which attenuates the voltage supply to neon lamp 20.

Increased current flow through load 4 increases the self-heating of thermistor 12. Since thermistors 12 and 14 are thermally coupled by epoxy resin 13, the thermal energy generated by current flow through thermistor 12 is transferred to thermistor 14. Generally, a high current flow is required to operate load 4. Current flow above the operational threshold required by load 4 causes thermistor 12 to heat to an equilibrium temperature well above the ambient temperature (100° C. above the ambient temperature). At this elevated equilibrium temperature, both resistors 12 and 14 have extremely low resistance values. The low resistance value of thermistor 12 permits maximum current flow to load 4 and has a negligible effect on the operation of load 4. The low resistance value of thermistor 14 also permits maximum current flow to neon lamp 20. When the full operational current flows through thermistor 12, the combined resistance of thermistor 14 and resistor 16 is at a minimum and neon indicator 20 reaches its full intensity. Resistor 16 limits the current supplied to neon lamp 20 to an appropriate value when current flow through load 4 is above the load's operational threshold level.

Decreased current flow through load 4 decreases the self-heating experienced by thermistor 12, which decreases the temperature of thermistor package 15. As the temperature of thermistor package 15 falls, the resistance value of thermistor 14 increases. Once the current flow through load 4 falls below the load's operational threshold level, the resistance value of thermistor 14 is sufficient to limit the current flow to neon lamp 20 and prevent illumination. At such time, the voltage divider formed by thermistor 14 and resistors 16 and 18 attenuates the supply voltage to a value below the ionization potential of the neon indicator (generally below 65 volts peak) and lamp 20 does not illuminate. Failure of neon lamp 20 to illuminate provides a visual indication that the current flow to load 4 is below the load's operational threshold.

It is understood that the above description does not limit the invention to the details given, but may be modified within the scope of the following claims.

I claim:

1. In an electrical system including a current source and an electrical load, an apparatus connectable between said current source and said load for indicating current flow through said load above a predetermined threshold level, said apparatus comprising:

a first and second thermistor, each thermistor electrically connected between said current source and said load, light means connected in series to said second thermistor and responsive to current flow through said second thermistor for illuminating when the voltage applied thereto is above a predetermined value, and bonding means intimately connecting said first and second thermistor for thermally coupling said first and second thermistor so that said first and second thermistors have substantially identical temperatures, said first thermistor connected in series between said current source and said load, said second thermistor having a resistance value which varies inversely with temperature and being connected in series to said light means, said first thermistor dissipates thermal energy to heat said second thermistor so that the resistance value of said second thermistor permits sufficient voltage to said light means to illuminate said light means only when said current flow through said load is above said threshold level.

2. The apparatus of claim 1 wherein said bonding means is an epoxy resin.

3. The apparatus of claim 1 wherein said light means is a neon lamp.

\* \* \* \* \*